US006730607B2

(12) United States Patent
Wurzer et al.

(10) Patent No.: US 6,730,607 B2
(45) Date of Patent: May 4, 2004

(54) METHOD FOR FABRICATING A BARRIER LAYER

(75) Inventors: Helmut Wurzer, Dresden (DE); Martin Schrems, Langebrück (DE); Anke Krasemann, Dresden (DE); Thomas Pompl, Ahdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/882,289

(22) Filed: Jun. 15, 2001

(65) Prior Publication Data

US 2002/0055269 A1 May 9, 2002

(30) Foreign Application Priority Data

Jun. 16, 2000 (DE) .......................... 100 29 658

(51) Int. Cl.⁷ .............................. H01L 21/302
(52) U.S. Cl. ............... 438/705; 438/694; 438/723; 438/740
(58) Field of Search ................ 438/694, 705, 438/714, 723, 740; 216/743, 87, 62, 72, 80, 97

(56) References Cited

U.S. PATENT DOCUMENTS

| 5,401,680 | A | | 3/1995 | Abt et al. ............... 437/52 |
| 5,679,982 | A | | 10/1997 | Gardner ............... 257/758 |
| 5,885,870 | A | * | 3/1999 | Maiti et al. ............ 438/261 |
| 6,072,689 | A | | 6/2000 | Kirlin ................. 361/311 |
| 6,323,046 | B1 | * | 11/2001 | Agarwal ................ 438/8 |

FOREIGN PATENT DOCUMENTS

| DE | 38.32.450 | | 4/1989 | .......... H01L/21/76 |
| JP | 51-145267 | * | 12/1976 | |
| JP | 63300518 | A | 12/1988 | |
| JP | 05-283679 | * | 10/1993 | |
| JP | 65-283679 | * | 10/1993 | |
| JP | 11345942 | A | 12/1999 | |

OTHER PUBLICATIONS

"Furnace Nitridation of Thermal Silica in Pure Nitrogen Oxide Ambient for ULSI MOS Applications"; IEEE Electron Device Letters (1992'); 13(2); pp. 117–119; Ahn et al.*
"Furnace Nitridation of Thermal Silica in Pure Nitrous Oxide Ambient for ULSI MOS Application"; Ahn et. al., (1992'); IEEE Electron Device Letters, 13(2); pp 117–119.*
Appl. Phys. Lett., 76(18):2538–2540, 2000.
J. Appl. Phys., 87(11):8201–8203, 2000.
Mater. Res. Soc., (INSPEC Abstract).
Weidner, G.,: Nitrogen incorporation during N₂0 and NO–oxiddation of silicon at temperatures down to 600 C. In: Microelectronics Journal, 1996, vol. 27, No. 7, pp. 647–656 (Inspect Abstract, Accession No. 1996: 5389302).

* cited by examiner

Primary Examiner—George A. Goudreau
(74) Attorney, Agent, or Firm—Fish & Richardson P.C.

(57) ABSTRACT

A method of fabricating a barrier layer includes oxidizing a silicon-containing substrate to form a substrate oxide layer on the surface of the substrate, producing an oxygen-impervious layer at an interface between the substrate oxide layer and the substrate, and etching the substrate oxide layer until the underlying oxygen-impervious layer is uncovered.

7 Claims, 3 Drawing Sheets

METHOD FOR FABRICATING A BARRIER LAYER

FIELD OF INVENTION

The invention relates to a method for fabricating a barrier layer which is suitable in particular for the fabrication of multilayer capacitive structures which have oxygen-rich metal oxide layers having high dielectric constants.

BACKGROUND

In MOSFET transistors, improved capacitive control of the conductive channel located uncler the oxide layer can be achieved by reducing he layer thickness of the gate dielectric or by using dielectric materials having high dielectric constants.

In volatile memory cells, in particular dynamic DRAM memory cells, the storage capacitance of the capacitive memory structures is decreased with increasing miniaturization, with the result that, for compensation, it is necessary to increase the capacitance per unit area or the capacitance per area. This is likewise achieved by reducing the thickness of the dielectric layer or by using dielectric materials having high dielectric constants.

Certain metal oxide layers are distinguished by particularly high dielectric constants. Known metal oxides having high dielectric constants are titanium dioxide, tantalum pentoxide or aluminum oxide, Such metal oxides are fabricated by application of a metal layer and subsequent thermal oxidation thereof. In this case, the metal, such as, for example, titanium, tantalum or aluminum, is deposited by means of various deposition methods such as sputtering, CVD methods or MBE methods, and is subsequently thermally oxidized. Such metal oxide layers cannot, however, be applied directly on the substrate since, during the thermal oxidation of the metal layer, metal ions penetrate into the silicon substrate and form conductive metal silicide compounds which can cause short circuits. Therefore, there must be a barrier layer present between the applied metal layer and the silicon substrate before the metal layer s oxidized to form the metal oxide layer.

Hitherto, a layer made of silicon dioxide below the metal layer has been used as barrier layer. However, such a silicon dioxide barrier layer has the disadvantage that, during oxidation of the metal layer lying above it, the silicon dioxide barrier layer grows into the silicon substrate and is thus widened. The widening of the silicon dioxide layer results in a considerable reduction in the capacitance of the multilayer capacitive structure comprising the metal oxide layer and the underlying silicon dioxide layer.

The object of the present invention, therefore, is to provide a method for fabricating an oxygen-impervious barrier layer which makes it possible to form a capacitive structure with a meal oxide without contaminating the substrate.

SUMMARY

The invention provides a method for fabricating a barrier layer having the following steps, namely oxidation of a substrate composed of silicon in order to produce a substrate oxide on the surface of the substrate; production of an oxygen-impervious layer at the interface between the substrate oxide layer and the substrate, the oxygen-impervious layer, as barrier, preventing the formation of metal silicide compounds between applied metal and the substrate silicon; etching of the substrate oxide layer until the underlying oxygen-impervious layer is uncovered.

The method according to the invention affords the advantage that, during the growth of a metal oxide layer on the barrier layer, no oxygen can penetrate through the barrier layer and, consequently, no undesirable silicon dioxide layer which reduces the capacitance can be produces between the barrier layer and the substrate.

In a first embodiment of the fabrication method according to the invention, the oxygen-impervious layer is produced by implanting nitrogen ions into the substrate, the substrate being oxidized in such a way that a substrate oxide layer and an underlying substrate-nitrogen compound as oxygen-impervious layer are formed.

In an alternative embodiment of the method according to the invention, the oxygen-impervious layer is produced by the substrate oxide produced on the surface of the substrate being exposed to a nitrogen-rich gas in such a way that a substrate-nitrogen compound as oxygen-impervious layer forms at the interface between the substrate oxide and the substrate.

In this case, the substrate oxide is preferably exposed to a pure nitrogen gas, an NO gas, an $N_2O$ gas or an $NH_3$ gas.

The substrate-nitrogen compound preferably comprises pure silicon nitride.

In a further embodiment, the substrate-nitrogen compound comprises silicon oxynitride.

In a first embodiment, the substrate oxide layer is etched by wet-chemical etching of the substrate oxide layer.

In a further embodiment of the method according to the invention, the substrate oxide layer is etched in a dry etching process.

Preferred embodiments of the method according to the invention are described below with reference to the accompanying drawings in order to elucidate features which are essential to the invention.

DETAILED DESCRIPTION

Figure 1A:
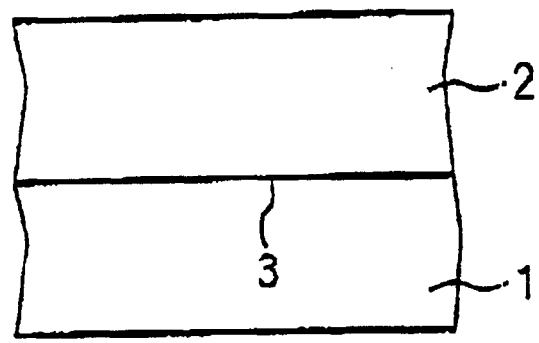
FIGS. 1a, 1b, 1c show process steps of a first embodiment of the invention's method for fabricating a barrier layer.
Figure 1B:
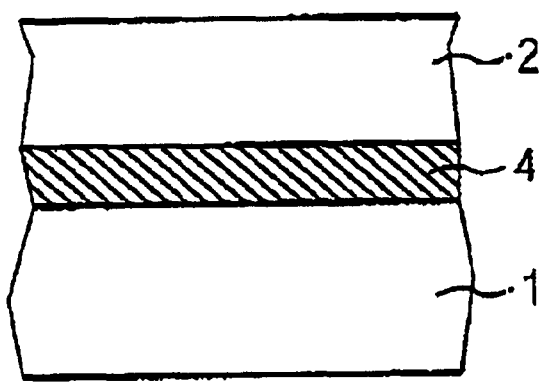
Figure 1C:
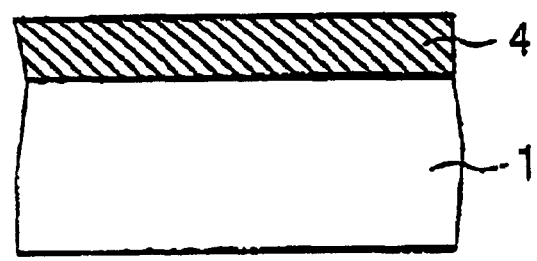

Process steps for elucidating a first embodiment of the fabrication method according to the invention can be gathered from FIGS. 1a, 1b, 1c.

A silicon dioxide layer 2 is formed on a silicon substrate by thermal oxidation or deposition. Afterward, the silicon dioxide layer 2 formed is exposed to a nitrogen-rich gas. A nitrogen-rich gas is preferably pure nitrogen gas or $N_2$ gas. As an alternative to this, it is possible to use NO gases, $NO_2$ gases, $NH_3$ gases or a gas mixture of such compounds as nitrogen-rich gas. The nitrogen combines with the unsaturated compounds at the interface 3 between the silicon substrate 1 and the silicon dioxide layer 2.

A substrate-nitrogen compound 4 is thus produced at the interface 3, as can be seen from FIG. 1b. The substrate-nitrogen compound preferably comprises pure silicon nitride. As an alternative to this, silicon oxynitride can also be formed as substrate-nitrogen compound, depending on the process parameters. Afterward, the silicon dioxide layer 2 or the substrate oxide layer is etched until the underlying oxygen-impervious layer 4, comprising silicon nitride or silicon oxynitride, is uncovered, and the structure as illustrated in FIG. 1c is produced. The silicon dioxide layer 2 is etched either in a wet-chemical etching process or in a dry etching process.

Figure 2A:
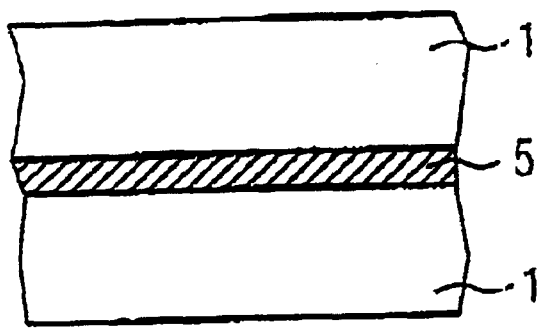
FIGS. 2a, 2b, 2c show process steps of a second embodiment of the invention's method for fabricating a barrier layer.
Figure 2B:
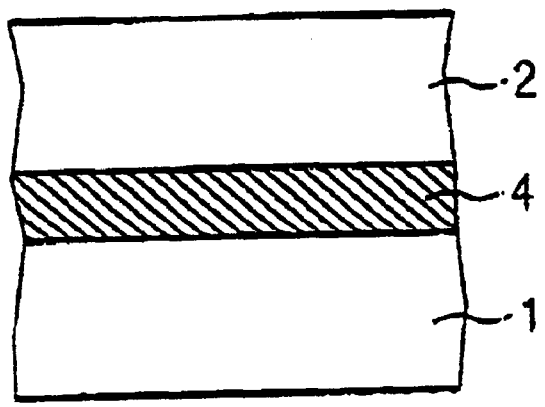
Figure 2C:
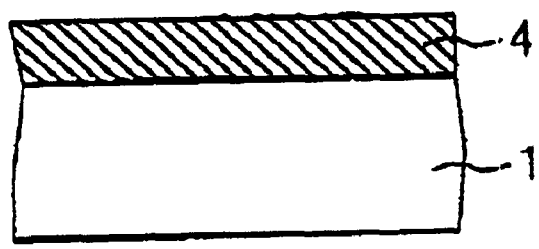

FIGS. 2a, 2b, 2c show process steps of an alternative embodiment of the invention's method for fabricating a barrier layer.

In this case, firstly nitrogen ions are implanted into the substrate 1 in order to form a nitrogen ions compound in the substrate 1. The nitrogen ions are preferably implanted into the :substrate with an acceleration energy of 10 to 20 keV. The distribution of the nitrogen ions is Gaussian, The nitrogen ion distribution is indicated by the reference symbol 5 in FIG. 2a.

Afterward, the substrate is oxidized in such a way that a substrate oxide layer 2 and an underlying substrate-nitrogen compound layer 4 as oxygen-impervious layer are formed in this case, during the oxidation, nitrogen accumulates at the interface between the substrate oxide layer 2 formed and the substrate 1. The layer 4 preferably contains silicon nitride as substrate-nitrogen compound. As an alternative to this, the substrate-nitrogen compound may also be formed by silicon oxynitride.

Afterward substrate oxide 2 or silicon dioxide 2 is removed by means of a dry- or wet-chemical etching process, thereby producing the structure shown in FIG. 2c.

The barrier layer produced by the fabrication method according to the invention is outstandingly suitable for forming a multilayer capacitive structure containing a metal oxide layer.

Figure 3A:
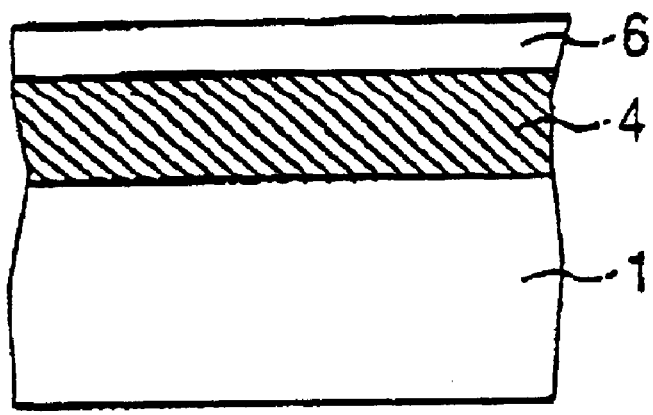
FIGS. 3a, 3b show process steps for forming a multilayer capacitive structure containing a metal oxide layer having a high dielectric constant.

For this purpose, as shown in FIG. 3a, the structure with the barrier layer 4 that has been produced in FIGS. 1c, 2c in accordance with the fabrication method according to the invention is coated with a metal layer 6. The metal layer 6 preferably comprises a metal which is simple to oxidize and whose metal oxide has a high dielectric constant. In his case, the metal layer 6 preferably comprises deposited titanium, tantalum or aluminum. The metal layer 6 can be deposited by sputtering, a CVD process or an MBE process.

The metal layer 6 is subsequently thermally oxidized, thereby producing a metal oxide layer 7 on the barrier layer 4, as can be discerned from FIG. 3b. In this case, the barrier layer 4 prevents chemical bonding of the metal to the silicon substrate 1, with the result that no undesirable metal silicide compounds can be produced. At the same time, the barrier layer 4 prevents oxygen atoms from penetrating through into the substrate 1 during the fabrication of the oxygen-rich metal oxide 7, with the result that a disturbing layer made of silicon dioxide cannot be produced at the interface 6 between the barrier layer 4 and the substrate 1.

Figure 3B:
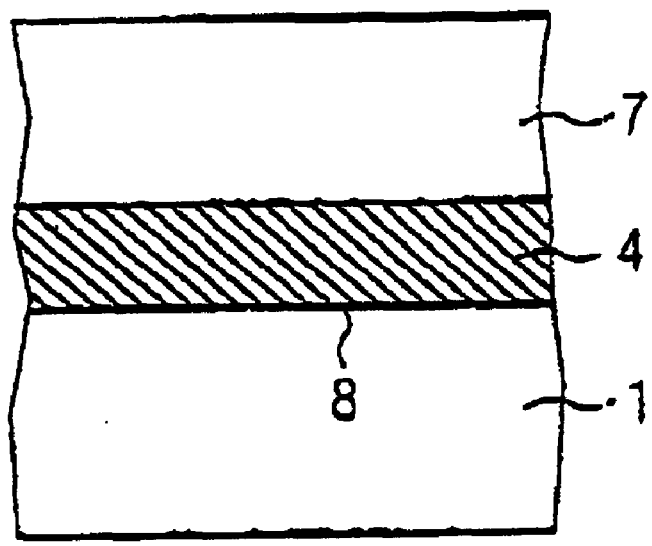

The capacitive structure which is shown in FIG. 3b and is produced by means of the fabricated barrier layer 4 has a particularly high capacitance per unit area. The reason for this is that, on the one hand, the metal oxide layer 7 itself has a high dielectric constant and, on the other hand, he barrier layer 4 formed comprises silicon nitride or silicon oxynitride, which likewise have a relatively high dielectric constant.

Since a disturbing silicon dioxide layer cannot be formed below the barrier layer 4 that is formed during the growth of the metal oxide layer 7, the total thickness of the capacitive structure is small, as a result of which the capacitance per unit area is likewise increased.

A further advantage of the barrier layer 4 formed according to the invention is that the band gap of silicon nitride or of silicon oxynitride is relatively high, with the result that tunneling currents through the barrier layer 4 are very small. This enables the barrier layer 4 to be made very thin, as a result of which the capacitance of the capacitive structure shown in FIG. 3b is increased further.

When the capacitive structure, as is shown in FIG. 3b, formed according to the invention is used for constructing memory cells, the small tunneling currents through the barrier layer 4 made of silicon nitride or silicon oxynitride have the effect that the leakage currents of the memory cell are very small and data can thus be stored long-term even in volatile memory cells, for example DRAM.

The silicon dioxide layer 2 used in the fabrication method is only required for the fabrication process. The silicon dioxide layer allows an underlying barrier layer 4 having a minimal thickness to be produced in a highly controlled manner in terms of process engineering.

The fabrication method according to the invention makes it possible at the same time to integrate metal oxide layers having very high dielectric constants, without violating the high MOS purity standards List of Reference Symbols 1 Substrate
2 Substrate oxide
3 Interface
4 Diffusion barrier layer
5 Ion implantation distribution
6 Metal layer
7 Metal oxide layer
8 Interface

What is claimed is:

1. A method of fabricating a barrier layer, the method comprising:
   oxidizing a silicon-containing substrate to form a substrate oxide layer on the surface of the substrate;
   producing an oxygen-impervious layer at an interface between the substrate oxide layer and the substrate;
   etching the substrate oxide layer until the underlying oxygen-impervious layer is uncovered;
   depositing a metal layer on a surface of the oxygen-impervious layer; and
   thermally oxidizing the metal layer;
   wherein the oxygen-impervious layer forms a barrier to the formation of metal silicide compounds between the deposited metal layer and the substrate.

2. The method of claim 1, further comprising:
   providing the oxygen-impervious layer by exposing the substrate oxide layer to a nitrogen-based gas, the oxygen impervious layer comprising a substrate-nitrogen compound.

3. The method of claim 2, further comprising:
   selecting the nitrogen-based gas from the group consisting of a $N_2$ gas, an $N_2O$ gas, an NO gas and an $NH_3$ gas.

4. The method of claim 2, further comprising:
   selecting the substrate-nitrogen compound to include a silicon nitride.

5. The method of claim 2, further comprising:
   selecting the substrate-nitrogen compound to include silicon oxynitride.

6. The method of claim 2, further comprising:
   etching the substrate oxide layer in a wet-chemical etching process.

7. The method of claim 2, further comprising:
   etching the substrate oxide layer in a dry etching process.

* * * * *